(12) United States Patent
Feider et al.

(10) Patent No.: US 7,829,796 B2
(45) Date of Patent: Nov. 9, 2010

(54) CIRCUIT JOINING ASSEMBLY MATERIALS FOR MULTI-LAYER LIGHTNING PROTECTION SYSTEMS ON COMPOSITE AIRCRAFT

(75) Inventors: David F. Feider, Renton, WA (US); Ralph E. Dufresne, Auburn, WA (US); Quynhgiao N. Le, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 451 days.

(21) Appl. No.: 11/935,993

(22) Filed: Nov. 6, 2007

(65) Prior Publication Data

US 2009/0114427 A1 May 7, 2009

(51) Int. Cl.
*H01R 12/04* (2006.01)

(52) U.S. Cl. ............... 174/261; 174/2; 174/255; 174/250; 361/212; 361/218

(58) Field of Classification Search ......... 174/254–259, 174/261, 250, 2, 6; 361/218, 212, 217, 220
See application file for complete search history.

(56) References Cited

U.S. PATENT DOCUMENTS

| 4,715,928 A | * | 12/1987 | Hamby ................. 216/18 |
| 5,004,639 A | * | 4/1991 | Desai ................. 428/138 |
| 5,429,326 A | * | 7/1995 | Garesche et al. ........ 244/133 |
| 6,114,050 A | * | 9/2000 | Westre et al. ......... 428/608 |
| 6,841,738 B2 | * | 1/2005 | Michiwaki et al. ...... 174/254 |
| 7,223,318 B2 | * | 5/2007 | Rajabali ............ 156/323 |
| 2006/0101754 A1 | * | 5/2006 | Risi ................. 52/403.1 |

* cited by examiner

*Primary Examiner*—Dameon E Levi
*Assistant Examiner*—Hoa C Nguyen

(57) ABSTRACT

An exemplary embodiment provides a multi-layer circuit joining assembly material configured to repair multi-layer flex circuits deployed on or in a composite surface as a lightning protection system. The multi-layer circuit joining assembly material includes a first conductive layer having a first end portion, a second conductive layer having a second end portion, and a dielectric material between the first conductive layer and the second conductive layer.

9 Claims, 3 Drawing Sheets

CIRCUIT JOINING ASSEMBLY MATERIALS FOR MULTI-LAYER LIGHTNING PROTECTION SYSTEMS ON COMPOSITE AIRCRAFT

TECHNICAL FIELD

The embodiments described herein generally relate to circuit joining assembly materials and methods for lightning protection systems of composite vehicles, such as aircraft, and more particularly relate to circuit joining assembly materials and methods for multi-layered, multi-functional flexible circuits embedded in composite vehicle surfaces.

BACKGROUND

Use of composites, such as carbon fiber reinforced plastics (CFRP), is becoming more common in aerospace applications for a many reasons including that composites allow designers to improve structural performance and reduce aircraft weight. Generally, composites include a reinforcing material embedded in a matrix of a polymeric composition. The reinforcing material may be oriented ply, woven fabric, particulates, or another form that provides suitable performance as a reinforcing material. The reinforcing material may be fiber glass, carbon fiber or other suitable reinforcement. The more typical polymer matrix material in aerospace applications is an epoxy resin but other polymers may also be suitable.

While composites have the advantage of low weight and high strength, the electrical properties of composites are very different from the metals that the composites often replace in aerospace applications, such as aluminum. Aerospace structural metals are generally highly conductive compared to composites. As a result, composites cannot distribute current and heat from a lightning strike (typical about 100,000 Amperes at 50,000 Volts) as quickly as metals.

Several techniques have been developed to provide lightning protection for composite structures. In general, these require the addition or incorporation of metallic conductors into composite exterior (or "near exterior") surfaces of the aircraft (such as skin panels on the wings and fuselage) capable of distributing and diverting current away from flight critical areas and underlying aircraft components. The addition of metallic conductors has been approached in two ways: the use of metallic appliques applied in post-assembly operations and the integration of metal foil into the composite skin during composite lay-up. Applique-based systems have alternate layers (sheets) of dielectric and conductive materials applied over the composite structure surface and secured to the surface with an adhesive. This both insulates underlying aircraft components from a lightning strike and provides a conductive path for rapid distribution and dissipation of lightning current and heat. The conductive layer is typically aluminum or copper foil, either in solid or expanded (open mesh) form. The alternating dielectric layers can be polyimides, fluoropolymers or similar heat resistant, durable, high dielectric strength materials. The integrated foil systems may typically include copper or aluminum foil in either solid or expanded mesh form that is laminated into and co-cured with the composite material. This type of system provides a conductive path for diversion and distribution of lightning current which, in combination with special fasteners and other features, provides a degree of lightning protection for the composite structure.

BRIEF DESCRIPTION OF THE DRAWINGS

Various exemplary embodiments will hereinafter be described in conjunction with the following drawing figures, which are not to scale and wherein like numerals may be used to denote like elements.

DETAILED DESCRIPTION

Figure 1:
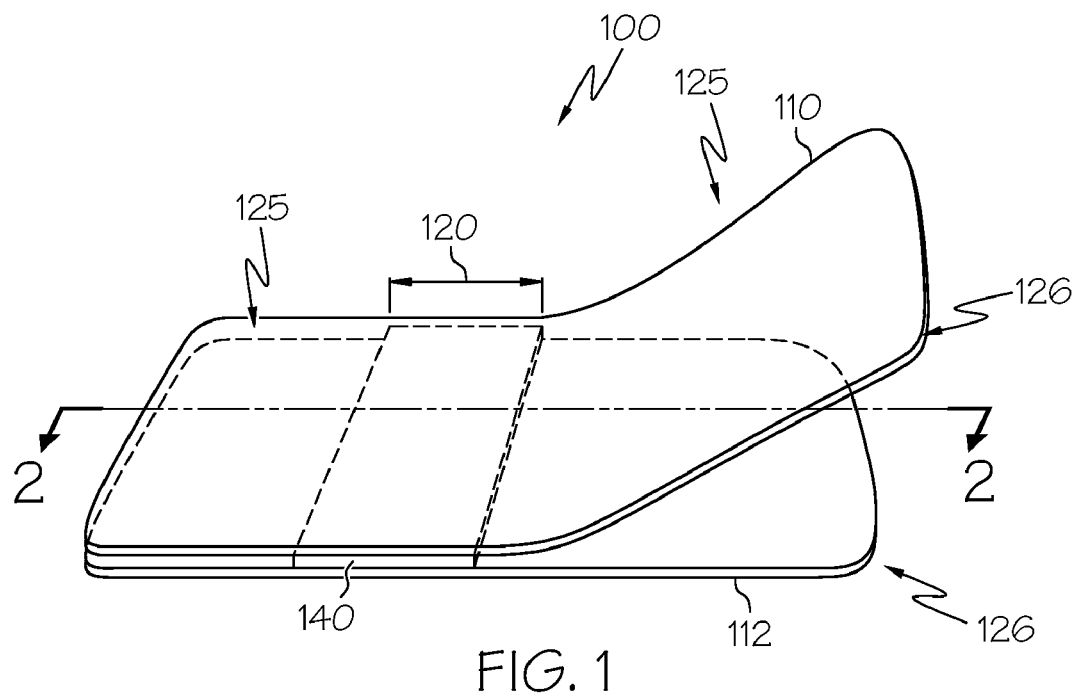
FIG. 1 is a perspective view of an exemplary embodiment of an exemplary embodiment of a multi-layer circuit joining assembly material in the form of an assembly joining clip with wings on one side peeled apart.

The following detailed description is merely exemplary in nature and is not intended to limit the described embodiments or the application and uses of the described embodiments. Furthermore, there is no intention to be bound by any expressed or implied theory presented in the preceding technical field, background, brief summary or the following detailed description. While to following description deals mainly with aircraft, embodiments of the multi-functional flex circuitry may find application in other areas utilizing composite structural material systems including for example: automotive, railroad, and maritime applications to map and assess mechanical or thermal damage, trigger alarms, and evaluate structural and functional integrity of critical control systems.

The present assignee's co-pending application U.S. Ser. No. 11/770,263 filed Jun. 28, 2007, which is hereby fully incorporated by reference, relates to multi-functional flex circuits that not only provide lightning protection but may also provide a range of other functions. Briefly, the co-pending application provides discloses technology relating to multi-functional flex circuitry that may be laminated into and co-cured with a composite substrate to provide lightning protection by acting as diverter of lightning current. The multi-functional flex circuitry may also include tuned conductor circuitry specifically designed and optimized for specific application areas. In addition, the multi-functional flex circuitry may also provide aircraft designers with a stable, expandable platform, with all necessary connection capability, for addition and incorporation of embedded sensing devices needed for a variety of applications.

Further, examples of the multi-functional integrated flex circuitry may be incorporated into aircraft skin and structural components, for example an aircraft wing, fuselage, tail structures, empennage, nacelle, or nose. Some embodiments may include a structure that essentially replicates a multilayer circuit board with embedded devices and connectivity in three dimensions. The multi-functional flex circuitry may be fabricated in a variety of ways including, for example, by using conventional processes for printed circuit board manufacturing, such as photo-imaging and etching of a metallized dielectric substrate. Typically, and without limitation, the film may be polyimide, epoxy/glass, fluorocarbons such as Teflon® (TEFLON is a trademark of DuPont of Delaware), or other flexible material(s) onto which conductive metal may be deposited in a thin shape-controlled layer to provide a circuit, and that may be incorporated into the composite by co-cure or by adhesion via an appropriate adhesive. Accordingly, other films that are compatible with the aircraft composite composition and other conductive metals may also be used. The metal conductor for the thin layer circuitry may be typically, without limitation, copper, aluminum, or a combination. The film and metal should desirably be selected to produce strong, flexible circuitry in the desired configuration and to comply with required mechanical and electrical requirements.

A film may be metallized and the metallized film may then be precision-etched to produce a thin metallic flex circuit by any of a number of techniques. Without limitation, for example, metallic circuits may be formed using photolithography techniques, to produce conductor patterns designed and optimized for lightning protection and/or other functions. The flex circuit so obtained may then be laminated and co-cured with composite (CFRP) material to produce an integrated self-contained system as a permanent part of the composite aircraft substrate (wing, skin panel, etc.). Of course, a layering of multiple flex circuits, each performing a different function, produces a multi-functional flex circuit. Electrical isolation between adjacent flex circuits may be controlled by interposing a dielectric film between them. Selective transfer of current and/or signals may be provided by means of vias or other suitable electrical interconnections that extend through the dielectric film layers.

In those examples wherein the multi-functional flex circuitry is integrated into the composite aircraft structure, it may provide a multi-layered platform for addition of embedded components and sensors with all necessary connectivity to support additional functions aside from lightning protection. Non-limiting examples of sensors and components easily supported on integrated flex circuitry include: embedded passive readout devices (EPRDs), embedded active readout devices (EARDs), Rogowski coils for current measurement, thermopiles, thermistors, fuses, radio frequency identification devices (RFIDs) and strain gauges. These sensors and components deployed on and connected with multi-functional flex circuitry can provide a variety of applications in communications, mitigation of electromagnetic interference (EMI), and real time monitoring of the health and condition of lightning protection and other aircraft systems.

Examples of flex circuits may include a thin polymeric film that is compatible with the resin of the composite into which it is to be integrated, and a metallic circuit pattern formed on the film. As pointed out above, the film may be polyimide, epoxy, fluorocarbon, or some other dielectric material. The resin matrix of the carbon composite may be an epoxy, for example. The film may be of a suitable thickness to facilitate the manufacturing process used to apply the metallic circuit pattern and to allow manipulation of the flex circuit during set-up for the integration of the flex circuit into the composite by co-cure or other process. Generally, the film thickness will vary by film type and the size of the flex circuit. For example, a wing of a typical composite airplane may be laid up in 20 ft. sections to cover critical wing tank fasteners. The copper, aluminum, silver, gold, nickel or other conductive metal on the flex film substrate is typically 0.0014 to 0.003 in. thick.

The present technology provides assembly joining and repair materials and methods of repairing multi-functional flex circuits that include, but are not limited to, those described above that are disclosed in our co-pending application. During the initial skin lay-up, the conductor provided by a multi-layer flex circuit system will consist of multiple sections that must be effectively joined to maintain electrical continuity of each layer. The present technology, in an exemplary embodiment, permits joining of two conductive layers in a flex circuit, while maintaining isolation between layers, using modular, pre-fabricated, multi-layered assembly joining clips that have layers and offsets precisely located to match the corresponding conductor layers in conductor circuit design.

The present technology, in an exemplary embodiment, permits repair or restoration of two, or several, conductive layers in a flex circuit, while maintaining isolation between layers, using modular, pre-fabricated, multi-layered repair patches or joining clips that have layers and offsets precisely located to match the corresponding conductor layers in the pre-prepared damaged areas. Some embodiments of the circuit joining assembly materials are flexible so that they may be laid down onto and conform to contoured surfaces that may form an underlying substrate supporting a multi-layer flex substrate, or into which the multi-layer flex circuit may be integrated. Exemplary embodiments of the circuit joining assembly materials, such as repair patches and "H" joining clips, may be fabricated as "standard items" that are kept in inventory. When a specific repair must be made, the prefabricated circuit joining assembly materials patches or joining clips may be more precisely configured for the particular repair to be made, or the area to be repaired or restored may be re-configured to register with and receive the prefabricated circuit joining assembly material.

Figure 2:
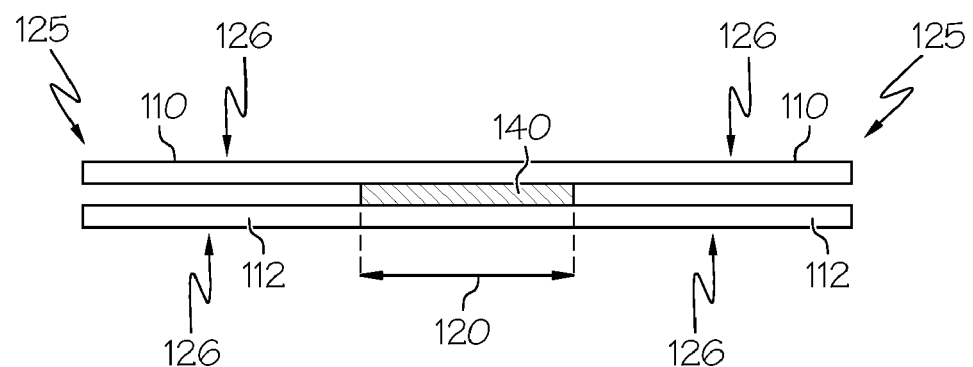
FIG. 2 is a cross section at 2-2 of the example of FIG. 1, when the wings are not peeled apart.

FIGS. 1 and 2 illustrate an exemplary embodiment of circuit joining assembly materials. The exemplary embodiment shows a two-conductive-layer (110, 112) assembly joining clip 100 that may be said to have a substantially "H" shape. It has two parallel sides of conductive layers 110, 112 separated by a transversely extending layer of dielectric material 140. The two conductive layers 110, 112 that are substantially co-extensive. In general, the conductive layers 110, 112 should desirably match the conductive layers of the multi-layer flex circuit being repaired. Thus, the conductive layers 110, 112 may, for example, be copper, aluminum, silver, gold, nickel or other conductive metal and may be 0.0014 to 0.003 in. thick, like the flex circuit. Of course, assembly joining clips may have a plurality of conductive layers, depending upon the number of conductive layers in the multi-layered flex circuit that must be repaired. In this example, the "H" assembly joining clip 100 has a central region 120 extending transversely across and between the two conductive layers 110, 112 that does not "peel open" like its two opposite end portions, 125, 125. Each of the two opposite end portions 125, 125 spread apart so that each has a pair of wings 126. A suitable adhesive may be applied on inboard surfaces of the wings 126 after the wings 126 are spread. The wings 126 are configured to overlap with and adhere to a conductive layer of a multi-layered flex circuit being repaired. The central region 120 has a central layer of a dielectric material 140 extending transversely across and between the two conductive layers 110, 112.

Figure 3:
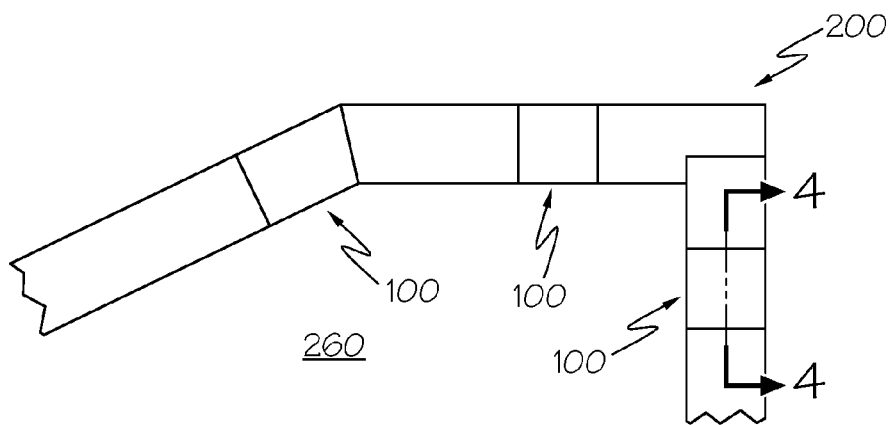
FIG. 3 is a top view illustrating repair areas of an exemplary embodiment of a multi-layer flex circuit.
Figure 4:
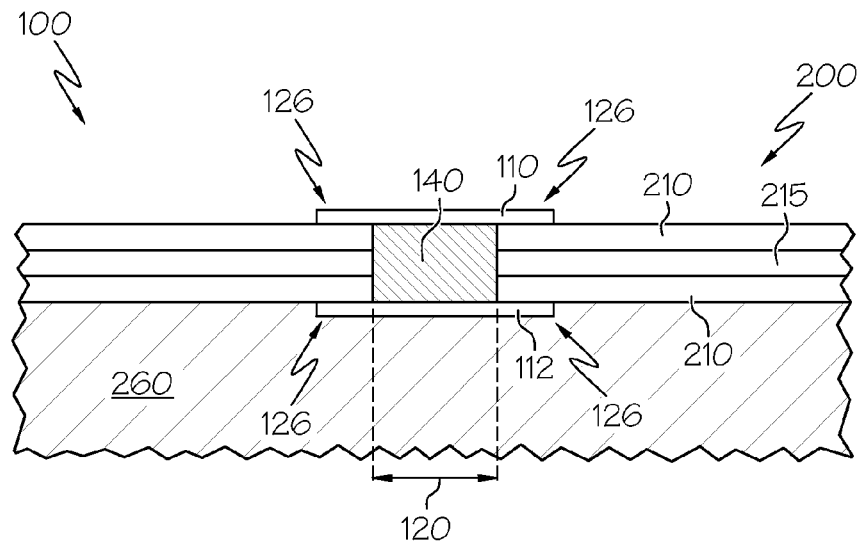
FIG. 4 is a cross sectional view along a portion of 3-3 of FIG. 2.

FIG. 3 illustrates a section of multi-layer flex circuitry 200 with a number of assembly joining clips 100. An example of an assembly joining clip in place is illustrated in cross section in FIG. 3. The multi-layered flex circuit 200 is laid onto, or integrated into, a composite surface 260. As shown in FIG. 4, the multi-layer flex circuit 200 has a pair of conductive layers 210, 210 separated by a dielectric layer 215. The assembly joining clip 100 is inserted into the area of the multi-layered flex circuit to be repaired such that wings 126, 126 of the assembly joining clip 100 overlap onto each of the pair of conductive layers 210 of the multi-layered flex circuit, on each side of the area to be repaired. This overlap re-establishes electrical continuity in each of the two conductive layers 210, 210 of the multi-layer flex circuit 200 via the intervening electrically conductive layers 110, 112 of the assembly joining clip 100. Electrical isolation of the conductive layers 210, 210 from each other is preserved by the layer of dielectric material 140 of the assembly joining clip 100.

Figure 5:
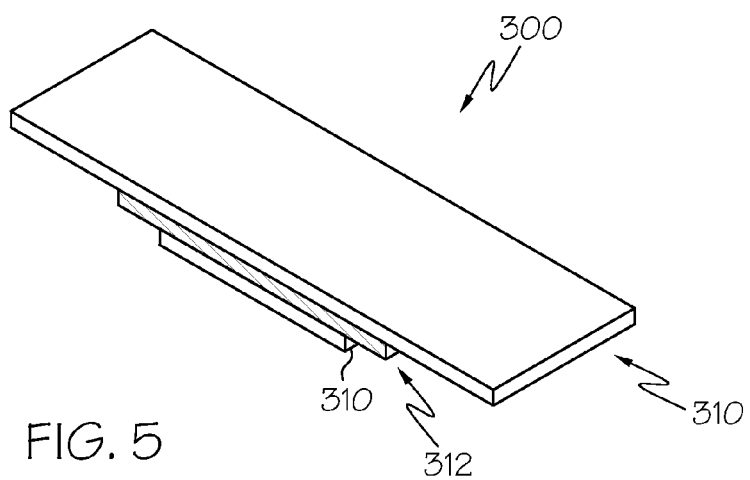
FIG. 5 is a perspective view of another exemplary embodiment of a multi-layer circuit joining assembly material.

FIG. 5 illustrates, in perspective view, another exemplary embodiment of a multi-layer circuit joining assembly material, in this case a multi-layer circuit multi-layer circuit repair patch 300. The multi-layer circuit repair patch 300 is multi-layered (has more than one conductive layer) and, in this example, has two conductive layers 310, separated by a dielectric layer 312. Of course, multi-layer repair patches may have a plurality of conductive layers separated by intervening dielectric layers, depending upon the number of conductive layers in the multi-layered flex circuit that must be repaired.

Figure 6:
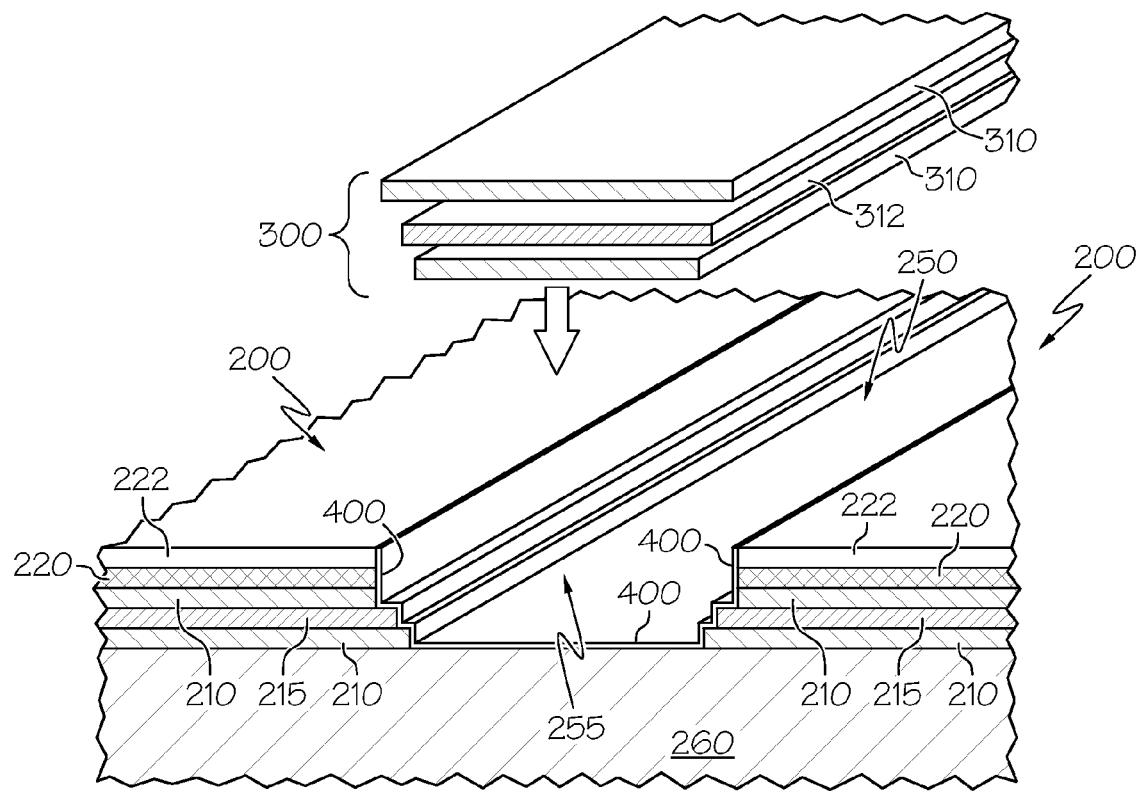
FIG. 6 illustrates in cross section an exemplary embodiment of a multilayer circuit joining assembly (in exploded view to show layers) being applied to a pre-prepared area of a multi-layered flex circuit to be repaired.

Referring to FIG. 6, the multi-layered flex circuit 200 is on or in a composite surface 260 and has an area to be restored or repaired 250. The area to be repaired 250 is pre-prepared by precisely cutting at its perimeter the layers of the multi-layered flex circuit 200 to produce a stepped layer configuration 255. Such stepped cutting may be carried out with a variety of tools, for example, a precision router tool. Desirably, this cutting produces a configuration that precisely registers with the shape of a prefabricated circuit assembly joining patch, like multi-layer circuit repair patch 300. If this is not possible, then the perimeter of multi-layer circuit repair patch 300 is similarly precision cut with a tool to conform to and precisely register layers of the multi-layer circuit repair patch 300 with appropriate corresponding layers of the multi-layered flex coating 200 in the stepped layer configuration 255 of the area to be repaired 250.

Figure 7:
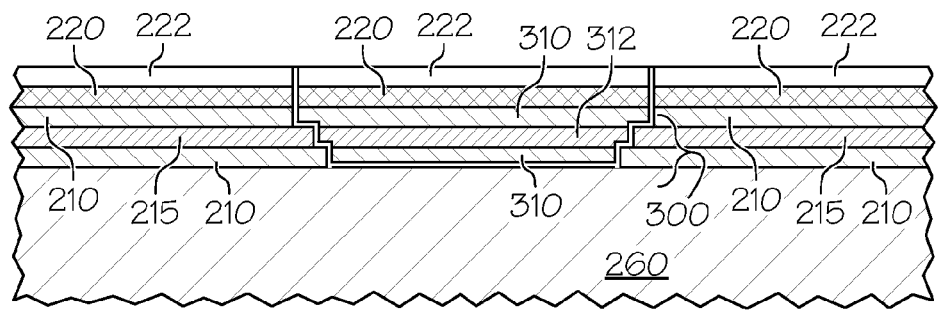
FIG. 7 illustrates a cross-sectional view of the repaired multi-layered flex circuit of FIG. 6.

In order to repair the multi-layer flex circuit 200, a suitable adhesive should be applied to either the multi-layer circuit repair patch 300 (shown in exploded perspective view in FIG. 6), or to the stepped layer configuration 255. In the illustrated example, a thin adhesive in the form of a flexible prepreg 400 is applied to the stepped configuration. The flexible prepreg may include a carrier and an adhesive applied to and impregnating the carrier. For example, the carrier may be a glass fiber cloth and the adhesive may be any suitable adhesive for use in repairing a multilayer flex circuit. Such adhesives may include, for example, B-staged epoxy film or liquid epoxy resin when the multi-layer flex circuit includes copper layers with a polyimide dielectric between them. The multi-layer circuit repair patch 300 is then placed into the stepped layer configuration 255 such that conductive layers 210, 210 register with and are coextensive with conductive layers 310, 310, and such that dielectric layer 215 registers with and is coextensive with dielectric layer 312. Accordingly, electrical continuity is re-established between opposite sides of area to be repaired 250 while electrical isolation between conductive layers 210, 210 is maintained. This is best seen in the cross sectional view in FIG. 7. Once the multi-layer circuit repair patch 300 is secured in place by the adhesive, coating layers overlying of the multi-layer flex circuit 200 may be repaired, such as the epoxy-glass surface layer 220 and the paint system 220, in this particular example.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A lightning protection system for a composite structure, the system comprising:
    a lightning protection article including first and second metallic circuits separated by a polymeric film, the article having a damaged portion that defines first and second opposing edges, the metallic circuits patterned to divert lightning current; and
    a repair connector including a first conductive layer for bridging the first and second edges of the first metallic circuit, a second conductive layer for bridging the first and second edges of the second metallic circuit, and a strip of dielectric material between the first and second conductive layers for electrically isolating a central portion of the first conductive layer from a central portion of the second conductive layer.

2. The system of claim 1, wherein a perimeter region of the first conductive layer and the second conductive layer is configured to register with a stepped-layer perimeter of the damaged portion of the lightning protection article.

3. An aircraft component including a composite structure and the lightning protection system of claim 1 on the composite structure.

4. An aircraft comprising a composite structure having metal fasteners, and the lightning protection system of claim 1, the metallic circuits configured to divert lightning current away from the metal fasteners.

5. The system of claim 1, wherein each metallic circuit is also patterned with a plurality of conductive paths to provide connectivity for multi-function apparatus.

6. A lightning protection system for a composite structure comprising a first lightning protection article including first and second metallic circuits separated by a polymeric film; and a second lightning protection article including first and second metallic circuits separated by a polymeric film, the metallic circuits configured to divert lightning current; the system further comprising a connector consisting of a first conductive layer for joining the first metallic circuits; a second conductive layer for joining the second metallic circuits; and a strip of dielectric material electrically isolating a central portion of the first conductive layer from a central portion of the second conductive layer; wherein the first and second conductive layers are coextensive and wherein the dielectric strip extends transversely across a central portion of both layers to give the connector a substantially H-shape.

7. The system of claim 6, wherein each metallic circuit is also patterned with a plurality of conductive paths to provide connectivity for multi-function apparatus.

8. An aircraft component including a composite structure and the lightning protection system of claim 6 on the composite structure.

9. An aircraft comprising a composite structure having metal fasteners, and the lightning protection system of claim 6, the metallic circuits configured to divert lightning current away from the metal fasteners.

* * * * *